(12) United States Patent
Kato et al.

(10) Patent No.: US 7,119,419 B2
(45) Date of Patent: Oct. 10, 2006

(54) DETAILED DESCRIPTION OF THE PRESENTLY PREFERRED EMBODIMENTS

(75) Inventors: Yoshihiro Kato, Tokyo (JP); Katsumi Okayama, Kanagawa (JP); Kaoru Kobayashi, Chiba (JP); Tetsuya Yamamoto, Kanagawa (JP); Minoru Ikarashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/506,752

(22) PCT Filed: Dec. 19, 2003

(86) PCT No.: PCT/JP03/16341

§ 371 (c)(1),
(2), (4) Date: Sep. 3, 2004

(87) PCT Pub. No.: WO2004/064149

PCT Pub. Date: Jul. 29, 2004

(65) Prior Publication Data

US 2005/0116255 A1    Jun. 2, 2005

(30) Foreign Application Priority Data

Jan. 15, 2003  (JP) .............................. 2003-006468

(51) Int. Cl.
*H01L 23/552* (2006.01)
(52) U.S. Cl. ...................... 257/659; 257/421; 257/660; 257/295; 438/3; 438/5
(58) Field of Classification Search ................ 257/659, 257/660, 295, 421; 438/3, 5
See application file for complete search history.

(56) References Cited

U.S. PATENT DOCUMENTS

| | | | |
|---|---|---|---|
| 6,515,352 B1 * | 2/2003 | Spielberger et al. | 257/659 |
| 6,724,027 B1 * | 4/2004 | Bhattacharyya et al. | 257/295 |
| 6,808,940 B1 * | 10/2004 | Sharma et al. | 438/3 |
| 2002/0008988 A1 * | 1/2002 | Lenssen et al. | 365/158 |
| 2004/0043516 A1 * | 3/2004 | Sharma et al. | 438/3 |

FOREIGN PATENT DOCUMENTS

| | | |
|---|---|---|
| JP | 2003-115578 | 4/2003 |
| JP | 2003-297983 | 10/2003 |
| WO | WO 03/034496 | 4/2003 |

* cited by examiner

*Primary Examiner*—Andy Huynh
*Assistant Examiner*—Tram H. Nguyen
(74) *Attorney, Agent, or Firm*—Sonnenschein Nath & Rosenthal LLP

(57) ABSTRACT

A memory device is proposed which enables to guarantee the operation of MRAM elements being magnetically shielded against a large external magnetic fields without being affected by an internal leakage magnetic field. The MRAM elements 30 which are shielded by magnetic shield layers 33, 34 are placed at an intermediate region 41 avoiding an edge region 43 and a center region 42 of the magnetic shield layers 33, 34 so that the MRAM element is secured to operate normally without being affected by the internal leakage magnetic field avoiding the edge region 43 where the magnetic shield effect is reduced by the exterior magnetic field, and avoiding the central region 42 where the internal leakage magnetic field is large.

6 Claims, 14 Drawing Sheets

| MAGNETIC SHIELD LAYER THICKNESS d/μm | CENTRAL PORTION MAGNETIC FIELD STRENGTH /Oe |
|---|---|
| 200 | 282 |
| 250 | 219 |
| 270 | 193 |
| 300 | 150 |
| 320 | 117 |
| 350 | 59 |
| 400 | 18 |
| 600 | 13 |
| 800 | 10 |

FIG. 10

| LENGTH ON ONE SIDE OF THE MAGNETIC SHIELD LAYER L/mm | CENTRAL PORTION MAGNETIC FIELD STRENGTH /Oe |
|---|---|
| 28 | 282 |
| 25 | 247 |
| 20 | 173 |
| 17 | 98 |
| 15 | 20 |
| 10 | 16 |

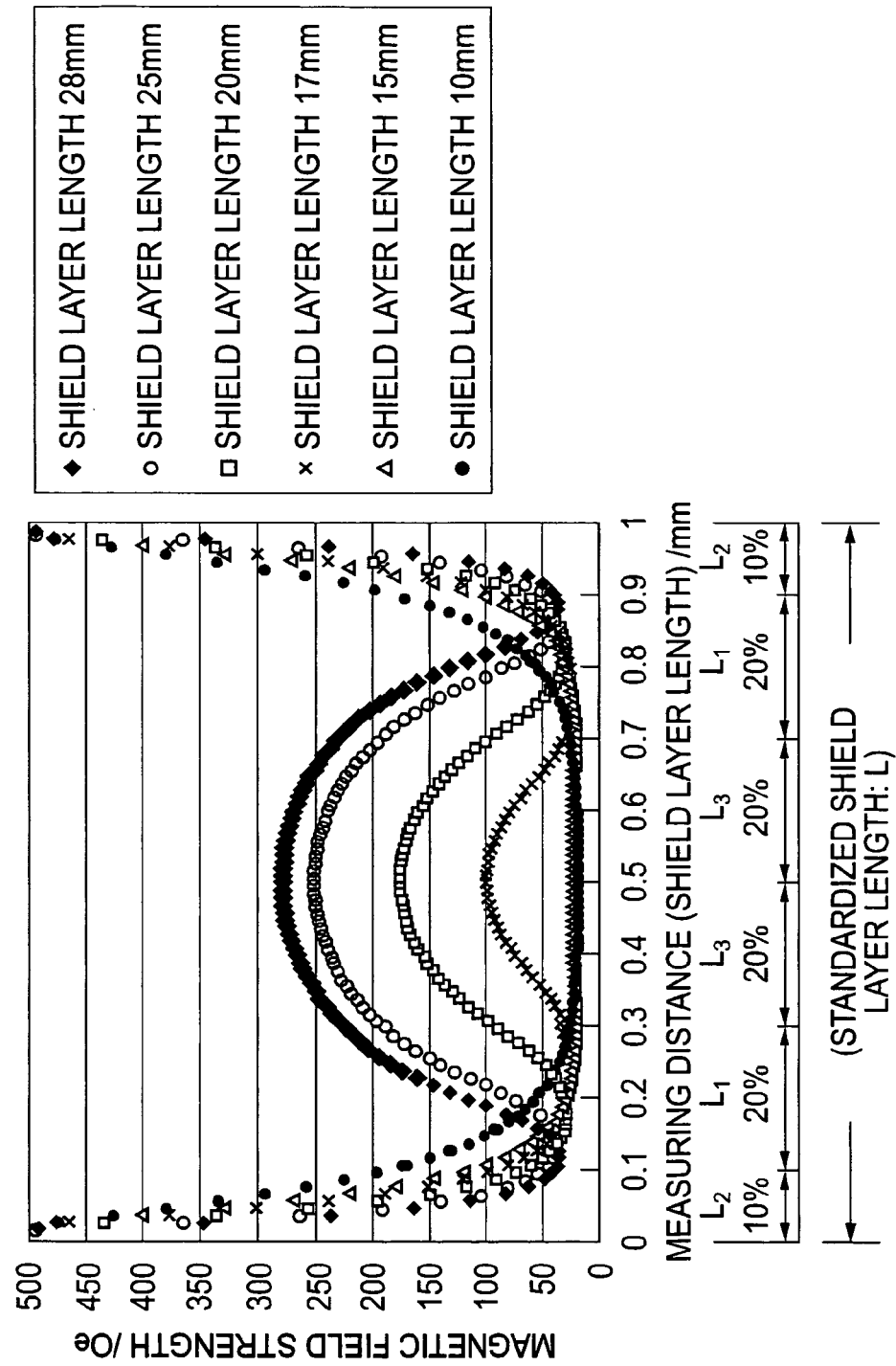

DETAILED DESCRIPTION OF THE PRESENTLY PREFERRED EMBODIMENTS

BACKGROUND OF THE INVENTION

The present invention relates to a magnetic memory device constructed as a magnetic random access memory (MRAM) or a so-called non-volatile MRAM (Magnetic Random Access Memory) which is comprised of memory elements made by laminating a magnetization pinned layer in which the orientation of magnetization is fixed and a magnetic layer in which the orientation of magnetization is changeable, or to any magnetic memory device comprising memory elements having a magnetic layer capable of being magnetized.

With a rapid prevalence of information communication equipment, in particular, of personal compact equipment such as portable terminals, a further improvement in performance inclusive of larger scale integration, faster speed, lower power consumption or the like is demanded for their elements such as memories, logics and the like.

In particular, the non-volatile memory is considered to be indispensable in the age of ubiquitous. If a power supply is exhausted or a power trouble occurs, or even if a connection between the server and the network is cut off by any failure, the non-volatile memory can protect important information including personal information. Further, although recent portable equipment is designed to hold unnecessary circuitry blocks in a standby state in order to suppress power consumption as much as possible, if a non-volatile memory that can function both as a high speed work memory and as a large capacity storage memory is realized, losses of the power consumption and the memory can be eliminated. Still further, if a high speed and large capacity non-volatile memory can be realized, an "instant-on" function that can be instantaneously activated upon power-on operation becomes possible.

As the non-volatile memories, there are also cited a flash memory which uses semiconductors, a FRAM (Ferroelectric Random Access Memory) which uses a ferroelectric material, and the like.

However, the flash memory has a drawback that a write speed is low in the order of $\mu$ seconds. On the other hand, also in the FRAM, problems are cited that because the number of rewritable frequencies is $10^{12}$ to $10^{14}$, the endurance thereof is too small to completely replace SRAM (Static Random Access Memory) or DRAM (Dynamic Random Access Memory), and that micro fabrication of a ferroelectric capacitor is not easy.

Drawing attention as a non-volatile memory having no such drawbacks as described above, featuring a high speed, large capacity (large scale integration) and a low power consumption, is a so-called MRAM (Magnetic Random Access Memory), for example, described by Wang et al., in IEEE Trans. Magn. 33 (1997), 4498, which has begun to draw much attention by recent remarkable improvements in the characteristics of TMR (Tunnel Magnetoresistance) materials.

An MRAM is a semiconductor memory which utilizes a magnetoresistance effect based on a spin dependent conducting phenomenon characteristic to a nano-magnetic substance, and is a non-volatile memory capable of retaining information without power supply from external.

Moreover, because of its simple structure, MRAM is easy to integrate into a large scale IC, and because of its recording of information based on spinning of magnetic moments, the number of rewritable frequencies is large, and also its access time is expected to become very fast as reported by R. Scheuerlein et al., in the ISSCC Digest of Technical Papers, pp. 128–129, Feb. 2000, where operability at 100 MHz was already reported.

Such a MRAM will be described more in detail. As illustrated in FIG. 14, a TMR element 10 which constitutes a memory cell in a memory element of MRAM includes a memory layer 2 in which magnetization is relatively easily rotated, and magnetization pinned layers 4, 6, laminated on a support substrate 9.

The magnetization pinned layer has two magnetization pinned layers of a first magnetization pinned layer 4 and a second magnetization pinned layer 6, and a conductive layer 5 is interposed therebetween for antiferromagnetically coupling these magnetic layers. As a memory layer 2 and magnetization pinned layers 4 and 6, a ferromagnetic material made of nickel, iron or cobalt, or an alloy thereof is used. Also, as a material of the conductive layer 5, any of ruthenium, copper, chrome, gold, silver or the like can be used. The second magnetization pinned layer 6 abuts an antiferromagnetic material layer 7. An exchange interaction occurring between these layers causes the second magnetization pinned layer 6 to have a strong unidirectional magnetic anisotropy. As a material of the antiferromagnetic material layer 7, a manganese alloys with such as iron, nickel, platinum, iridium, rhodium, or cobalt or nickel oxides may be used.

Further, between the memory layer 2 as the magnetic layer and the first magnetization pinned layer 4 there is sandwiched a tunnel barrier layer 3 which is an insulating body made of an oxide or nitride of aluminum, magnesium, silicon and the like, and functions to cut off a magnetic coupling between the memory layer 2 and the magnetization pinned layer 4 and also to pass a tunneling current therethrough. These magnetic layers and conductive layers are formed basically by a sputtering method, however, the tunnel barrier layer 3 can be obtained by oxidizing or nitriding a metal film deposited by sputtering. A top coat layer 1, which has a function to prevent mutual diffusion between the TMR element 10 and wiring to be connected thereto, to reduce a contact resistance, and to inhibit oxidization of the memory layer 2, can be made using such a material as Cu, Ta, TiN or the like. An underlayer electrode 8 is for connection with a switching element to be connected in series with the TMR element. This underlayer electrode 8 may serve also as an antiferromagnetic material layer 7.

In the memory cell constructed as described above, although information is read out by detecting changes in a tunneling current by the magnetoresistance effect to be described later, the effect thereof depends on relative orientations of magnetization in the memory layer and the magnetization pinned layer.

FIG. 15 is an enlarged perspective view showing a simplified portion of a general MRAM. Here, although a read-out circuit portion is omitted for simplification, there are included, for example, 9 pieces of memory cells, and mutually intersecting bit lines 11 and writing word lines 12. At each intersection therebetween, a TMR element 10 is disposed. Writing to the TRM element 10 is carried out in such a manner that by passing a current through the bit line 11 and the write word line 12, and by using a synthetic magnetic field resulting from respective magnetic fields generated therefrom, an orientation of magnetization in the memory layer 2 in the TMR element 10 disposed at each intersection of the bit line 11 and the write word line 12 is caused to rotate parallel or anti-parallel relative to that in the magnetization pinned layer.

FIG. 16 schematically illustrates a cross section of a memory cell, in which, for example, an n-type field effect transistor 19 for read out is disposed, comprising a gate insulation film 15, a gate electrode 16, a source region 17 and a drain region 18 which are formed in a p-type well region 14 formed in a p-type silicon semiconductor substrate 13, and above thereof there are disposed a write word line 12, a TMR element 10 and a bit line 11. To the source region 17, a sense line 21 is connected via a source electrode 20. The field effect type transistor 19 functions as a switching element for read-out, and a wiring 22 for reading which is wired out from between the word line 12 and the TMR element 10 is connected to the drain region 18 via a drain electrode 23. By way of example, the transistor 19 may be of any of n-type or p-type field effect transistors, and is not limited thereto, and various types of other switching elements such as diodes, bipolar transistors, MESFET (Metal Semiconductor Field Effect Transistors) and the like can be used.

FIG. 17 shows an equivalent circuit of an MRAM, which has, for example, 6 pieces of memory cells, mutually intersecting bit lines 11 and write word lines 12, and TMR elements 10 provided at each intersection of these write word lines together with a field effect transistor 19 for selection of an element for reading which is connected to the TMR element 10 and to a sense line 21. The sense line 21 which is connected to a sense amplifier 27 detects stored information. By way of example, numeral 24 in the drawing depicts a bidirectional write word line current drive circuit, and 25 depicts a bit line current drive circuit.

FIG. 18 is an asteroid curve showing write conditions to write to the MRAM, and indicates a threshold value for reversing the orientation of magnetization in the memory layer by a magnetic field $H_{EA}$ applied in the directions of the easy axis of magnetization and a magnetic field $H_{HA}$ applied in the directions of the difficult axis of magnetization. If a synthetic magnetic field vector is produced outside this asteroid curve, a reversal of the magnetic field occurs, however a synthetic magnetic field produced inside the asteroid curve does not cause the cell to be reversed from either one of its current bistable state to the other. Further, also in any cells other than at intersections of the word lines and the bit lines both passing through the currents, because a singular magnetic field generated either by the word line or the bit line is applied thereto, if a magnitude thereof exceeds a monodirectional reversal magnetic field Hk, the orientation of magnetization in any cells outside the aforementioned intersections may be reversed. Therefore, it is arranged to permit a selective writing to a selected cell only when the synthetic magnetic field falls in a grey-colored region in the drawing.

As described above, as to the MRAM, it is general that by use of two write lines of the bit line and the word line, and utilizing the asteroid magnetization reversal characteristics, only a designated cell is allowed selectively to write in to be effected by reversal of a magnetic spin. A synthetic magnetic field in a unit memory region is determined by a vector synthesis of a magnetic field applied in the direction of the easy axis of magnetization $H_{EA}$ and a magnetic field applied in the direction of the difficult axis of magnetization $H_{HA}$. A current passing through the bit line applies a magnetic field in the direction of the easy axis of magnetization $H_{EA}$ to the cell, and a current passing through the word line applies a magnetic field in the direction of the difficult axis of magnetization $H_{HA}$ to the cell.

FIG. 19 illustrates operation of reading from MRAM. Here, a schematic diagram of a layer structure of a TMR element 10 is shown, in which the aforementioned magnetization pinned layer is depicted as a monolayer 26, and parts other than a memory layer 2 and a tunnel barrier layer 3 are omitted for simplification.

That is, as described above, writing of information is carried out by causing a synthetic magnetic field produced at the intersection between the bit lines 11 and the word lines 12 wired in a mesh to reverse the magnetic spin in the cell so as to store the information as "1" or "0". Further, reading of information is carried out by utilizing a TMR effect which makes use of the magnetoresistance effect. Here, the TMR effect refers to such a phenomenon that a value of electrical resistance is changed depending on the orientation of the magnetic spin, and that by detecting a high resistance state if the magnetic spin is oriented anti-parallel (reverse direction) and a low resistance state if the magnetic spin is oriented parallel (same direction), information of "1" and "0" is detected. This reading is carried out by causing a read current (tunneling current) to pass through between the word line 12 and the bit line 11, and reading out an output therefrom in accordance with the aforementioned high resistance or low resistance to the sense line 21 via the field effect transistor 19 for reading.

As described above, although the MRAM is expected as a high speed and large capacity non-volatile memory, because of use of the magnetic material for retention of information, there is such a problem that information is erased or rewritten by the effect of an external magnetic field. This is because that a reversing magnetic field $H_{SW}$ in the directions of the easy axis of magnetization and the difficult axis of magnetization described with reference to FIG. 18 is small in a range of 20 to 200 Oe, though it depends on a material, and a few mA in terms of an electric current (R. H. Koch et al., Phys. Rev. Lett. 84, 5419 (2000), J. Z. Sun et al., 2001 $8^{th}$ Joint Magnetism and Magnetic Material). In addition, because a coercive force (Hc) when writing is in a range of approximately a few Oe to 10 Oe, if an internal leakage magnetic field greater than that resulting from an external magnetic field is applied, it sometimes becomes impossible selectively to write to a designated memory cell.

Therefore, as one step to actual application of the MRAM, it is ardently desired to establish countermeasures against external magnetic fields, that is, an effective magnetic shield structure for shielding the elements from external electromagnetic waves.

An environment in which an MRAM is packaged and used is mainly on a high density packaging substrate, and inside electronics equipment. Although it depends on the types of electronic equipment, by recent developments of high density packaging techniques, there are densely packaged a variety of semiconductor elements, communication elements, a micro-motor and the like on a high density packaging substrate, and also antenna elements, various mechanical parts, power source and the like are densely packaged inside the electronic equipment thereby constructing a unit of equipment.

A capability of a mixed or hybrid packaging as described above is one of the features of an MRAM as a non-volatile memory, however, because of its environment surrounding the MRAM in which various magnetic field components in a broad frequency range including dc, low frequencies to high frequencies are mixed and coexist, it is required, in order to ensure reliability of information retaining in MRAM, to improve the durability thereof against the external magnetic fields by developing a new packaging method and a new shield structure of the MRAM itself.

As to a magnitude of such external magnetic fields, for example, in a magnetic card such as a credit card or a bank cash card, it is specified to have durability against a magnetic field from 500 to 600 Oe. Therefore, in the field of the magnetic card, a magnetic material having a large coercive force such as a Co clad gamma-$Fe_2O_3$, Ba ferrite or the like are used in compliance therewith. Also, in the field of prepaid cards, it is necessary to have durability against magnetic fields from 350 to 600 Oe. Because the MRAM element is packaged inside electronic equipment, and is a device expected to be carried on, it needs to have enough durability against strong external magnetic fields equivalent to that of the magnetic cards, and in particular, because of the reason described above, a magnitude of an internal (leakage) magnetic field is required to be suppressed below 20 Oe, or preferably below 10 Oe.

As a magnetic shield structure of MRAM, it is proposed to use an insulating ferrite (MnZn ferrite and NiZn ferrite) layer as a passivation film of an MRAM element so as to provide a magnetic shielding characteristic (refer to U.S. Pat. No. 5,902,690, specification (column 5) and drawings (FIG. 1 & FIG. 3)). It is also proposed to attach a high permeability magnetic body such as Permalloy on the top and bottom of the package so as to provide a magnetic shielding effect and prevent penetration of a magnetic flux into the internal element (refer to U.S. Pat. No. 5,939,772, specification column 2, FIGS. 1, 2). Further, a structure of a shield lid made of a magnetic material such as soft iron or the like for cladding the element is disclosed (refer to Japanese Patent Application Publication No. 2001-250206, right-hand column on page 5, FIG. 6).

In order to prevent penetration of an external magnetic flux into the memory cell of MRAM, it is most important to clad the element with a magnetic material having a high permeability so as to provide a magnetic path thereby allowing no magnetic flux to penetrate any further.

However, when the passivation film of the element is formed from ferrite as disclosed in U.S. Pat. No. 5,902,690, because of a low magnetic saturation in the ferrite itself (for example, 0.2 to 0.5 tesla (T) in general ferrite materials), it is impossible completely to prevent penetration of external magnetic fields. Magnetic saturation in the ferrite itself is approximately 0.2 to 0.35 T in NiZn ferrite, and 0.35 to 0.47 T in MnZn ferrite, however, a magnitude of an external magnetic field penetrating into the MRAM element is as large as several hundreds Oe, thereby only with such a degree of saturation magnetization provided by the ferrite, a permeability becomes almost "1" due to magnetic saturation in the ferrite thereby disabling its function. Further, although a film thickness is not described in U.S. Pat. No. 5,902,690, because a thickness of a normal passivation film is about 0.1 µm or so at most, it is too thin to serve as a magnetic shield layer, thereby any substantial effect cannot be expected. Moreover, in the case if ferrite is to be used as the passivation film, because the ferrite is an oxide magnetic material, when it is deposited by sputtering, an oxygen defect tends to occur, thereby making it difficult to obtain a perfect ferrite to be used as the passivation film.

Further, in U.S. Pat. No. 5,939,772, a structure for sandwiching the package between the upper and the bottom Permalloy layers is disclosed. By use of the Permalloy, a higher shield performance than that of the ferrite passivation film is obtained. However, although the permeability of the Mu metal disclosed in U.S. Pat. No. 5,939,772 is very high to become $\mu i=100,000$ or so, the magnetic saturation thereof is very low to be 0.7 to 0.8 T, at which it will easily saturate to an external magnetic field consequently to become $\mu=1$, therefore, there is a problem that in order to obtain a perfect magnetic shielding effect, a thickness of the shield layer must be increased considerably large. Therefore, as the structure for enabling to prevent penetration of magnetic fields of several hundreds Oe, in practice, it is not yet perfect as the magnetic shield layer in view of both drawbacks that the saturation magnetization thereof is too small and that the thickness thereof is too thin.

Still further, in Japanese Patent Application Publication No. 2001-250206, although a magnetic shield structure using soft iron or the like is disclosed, as this covers only the upper portion of the element, it is not perfect as the magnetic shield. Also, the magnetic characteristics thereof are not sufficient because that the saturation magnetization of the soft iron is 1.7 T and the permeability thereof is $\mu i=300$ or so. Therefore, even if a magnetic shield is fabricated using the structure disclosed in Japanese Patent Application Publication JP-A Laid-Open No. 2001-250206, it would be very difficult to completely prevent the penetration of external magnetic fields.

The present invention is contemplated to solve the aforementioned problems associated with the prior art, and to provide means for magnetically shielding MRAM elements sufficiently against large external magnetic fields, and also to guarantee reliable operation of the MRAM elements in an environment surrounding the MRAM elements which produces various magnetic fields.

SUMMARY OF THE INVENTION

The present invention relates to a magnetic memory device comprising memory elements each having a magnetic layer capable of magnetization, and in particular, to a magnetic memory device (hereinafter referred to as a magnetic memory device according to the embodiment of the present invention) which is constructed as a magnetic random access memory (MRAM) which has memory elements each comprising by laminating a magnetization pinned layer in which the orientation of magnetization is pinned (fixed) and a magnetic layer in which the orientation of magnetization is changeable, and further comprising a magnetic shield layer for magnetically shielding each of the memory elements, wherein the aforementioned memory elements are characterized by being disposed avoiding an edge portion and a center portion of the aforementioned magnetic shield layer.

As a result of diligent studies and discussions on the aforementioned problems, the inventors of the present invention have discovered that the magnetic shield effect attenuates with a progress of the magnetic saturation in a magnetic material of the magnetic shield layer, that the saturation of magnetization in a magnetic material, for example, in the shape of a plate, starts from a location where demagnetization becomes minimal (that is, the farthest point from the edge portion), and that in the case where a magnetic shield layer is applied to the package, the weakest portion of the magnetic shield effect is a central portion of the package.

On the basis of such recognition described above, the inventors of the present invention have discovered that by placing the memory elements avoiding the edge portion and the center portion of the magnetic shield layer, that is, by placing the memory elements in a region between the center portion of the magnetic shield layer, in which magnetic saturation easily tends to occur thereby allowing for an internal leakage magnetic field strength to become large, and the edge portion of the magnetic shield layer, in which no magnetic shield effect exists because of a direct exposure to an external magnetic field, the memory elements are ensured to operate normally without being affected by the internal leakage magnetic field, thereby enabling successfully to achieve the magnetic memory device according to the present invention.

BRIEF DESCRIPTION OF THE DRAWINGS

FIG. 10 is a table showing internal magnetic field strengths versus lengths of the magnetic shield layer which uses Fe-49Cc-2V under application of an external magnetic field at 500 Oe.

FIG. 12 is a distribution diagram of internal magnetic field strengths versus lengths of magnetic shield layers relative to a standardized length thereof according to the embodiment of the invention.

DETAILED DESCRIPTION OF THE PRESENTLY PREFERRED EMBODIMENTS

Figure 1A:
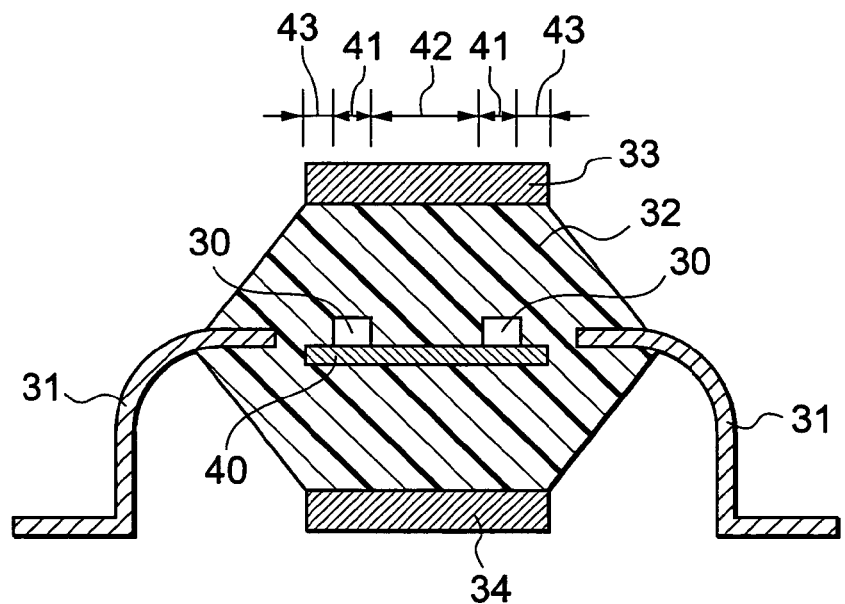
FIGS. 1A to 1B is a cross-sectional view of a schematic diagram of an MRAM package according to a preferred embodiment of the present invention (FIG. 1A), and a plan view thereof more in specific (FIG. 1B).

In a magnetic memory according to the preferred embodiment of the invention, when a length from one side of a magnetic shield layer to an opposed side thereof is assumed to be L, it is desirable for memory elements to be disposed in a region between a position at 0.1 L inward from the above-mentioned one side and a position at 0.15 L outward from the center of the magnetic shield layer toward the above-mentioned one side thereof, in consideration that an adverse effect by an internal leakage magnetic field can be easily avoided by the arrangement described above.

In this case, assuming that the magnetic shield layer is provided on both sides (top and bottom) of the memory element respectively, and that a distance between these magnetic shield layers, a length from the aforementioned one side of the magnetic shield layer to the opposed side thereof, and an external magnetic field to be applied are constant respectively, it is desirable for the aforementioned memory elements to be disposed in a region between a position at 0.2 L inward from the aforementioned one side and a position at 0.15 L outward from the center of the shield layer toward the aforementioned one side thereof.

Further, assuming that a distance between the aforementioned magnetic shield layers, a thickness of the magnetic shield layers and an external magnetic field to be applied are constant respectively, it is desirable for the aforementioned memory elements to be disposed in a region between a position at 0.1 L inward from the aforementioned one side thereof and a position at 0.2 L outward from the center of the shield layer toward the aforementioned one side thereof.

Then, in order for the magnetic shield layer to be able to exhibit the magnetic shield effect thereof, it is desirable for the magnetic shield layer to be disposed on the top and/or bottom of the package comprising by sealing the memory elements therein, or/and on the upper portion and/or the lower portion of the memory elements within the package, and further preferably the memory elements are to be present almost allover the package.

Further, the magnetic shield layer, other than provided in the form of a flat film or plate, may have concave and/or convex portions on its film or plate, or through-holes such as mesh or slits, in order to be able to more effectively suppress the magnetic saturation.

Then, it is desirable for the magnetic shield layer to be formed of soft magnetic material that exhibits saturation magnetism at 1.8 tesla or more in order to be able to lower the saturation magnetization in the magnetic shield layer.

The present invention is suitable to MRAM, however, this MRAM is preferably constructed such that an insulating material layer or a conductive material layer is sandwiched between the aforementioned magnetization pinned layer and the aforementioned magnetic layer, that with a magnetic field induced by passing a respective current through wirings of a bit line and a word line provided on the top and the bottom of the memory element, the orientation of magnetization in the aforementioned magnetic layer is aligned in a prescribed direction thereby writing information thereto, and that this written information is read out by use of the tunnel magnetoresistance effect (TMR effect) between the aforementioned wirings.

Now, by referring to the accompanying drawings, preferred embodiments of the present invention will be described more specifically in the following.

Figure 1B:
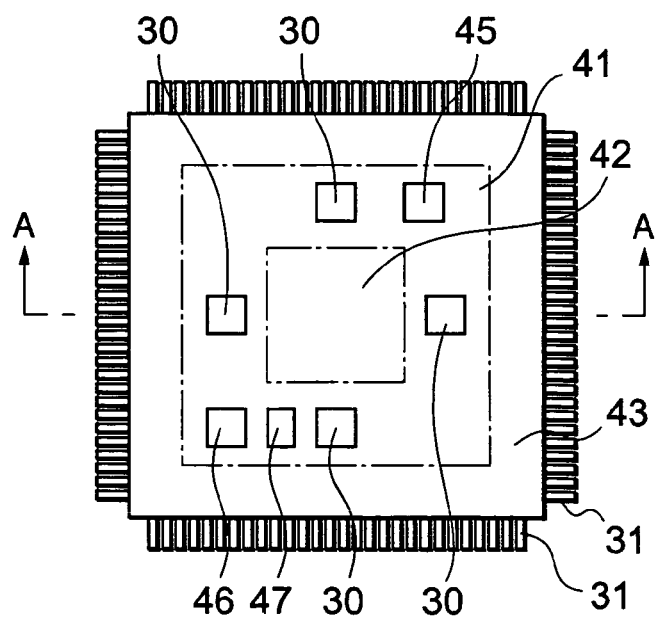
Figure 2:
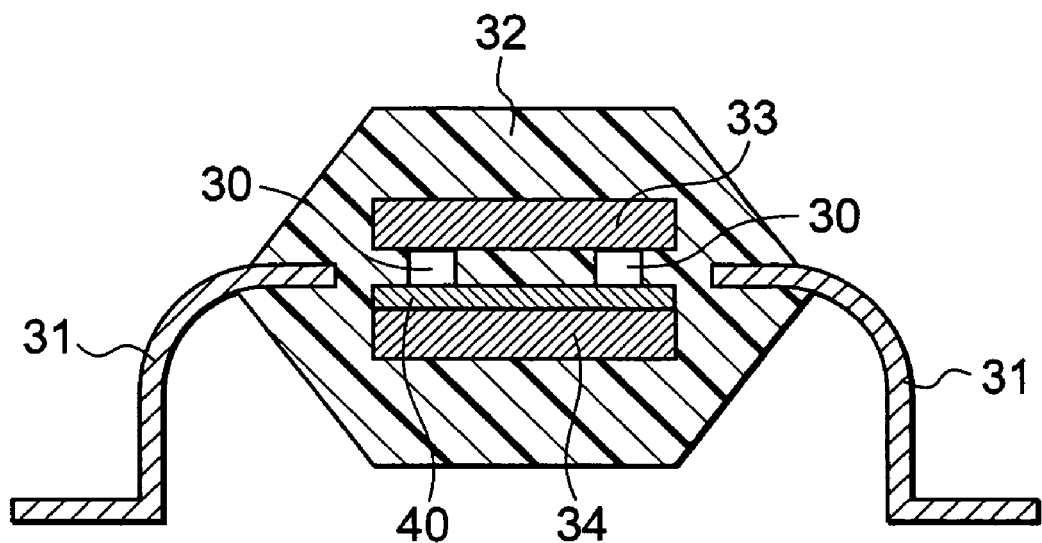
FIG. 2 is a cross-sectional view of a schematic diagram of another MRAM package according to the preferred embodiment of the present invention.
Figure 3:
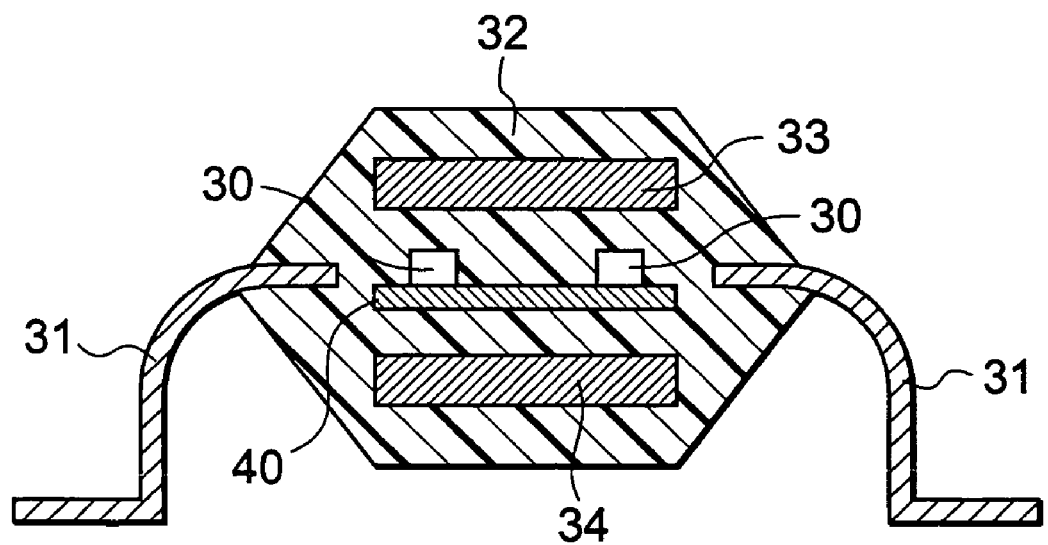
FIG. 3 is a cross-sectional view in schematic of still another MRAM package according to the preferred embodiment of the present invention.

FIG. 1A to FIG. 3 illustrate respective MRAM packages having various types of magnetic shield structures according to the preferred embodiments of the present invention (FIG. 1A shows a cross-sectional view in schematic cut out along line A–A' in FIG. 1B which shows a plan view of a package more specifically).

Figure 14:
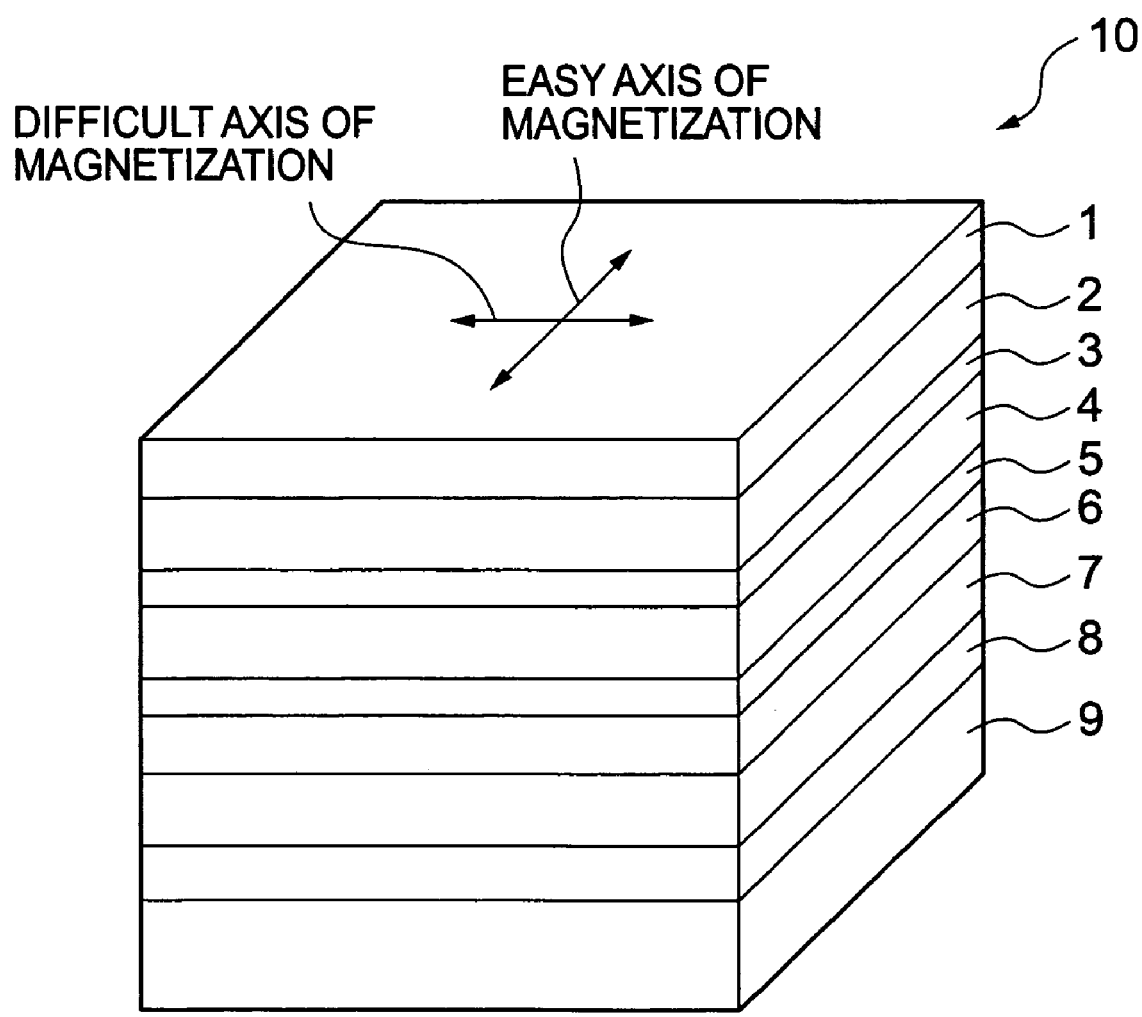
FIG. 14 is a perspective view in schema of a TMR element in MRAM.
Figure 15:
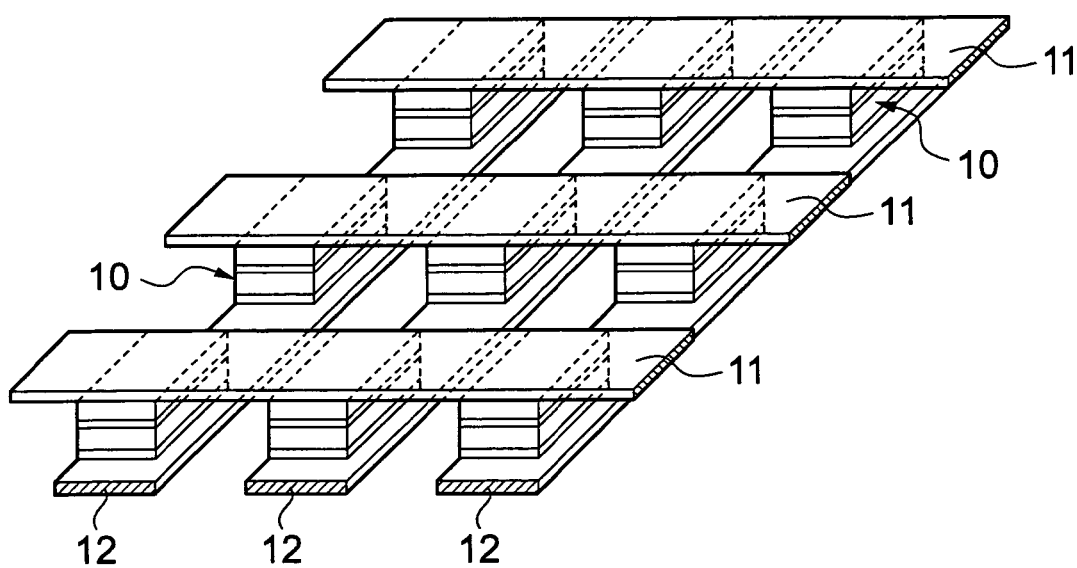
FIG. 15 is a perspective view in schema of a plurality of a memory cells in an MRAM element.
Figure 16:
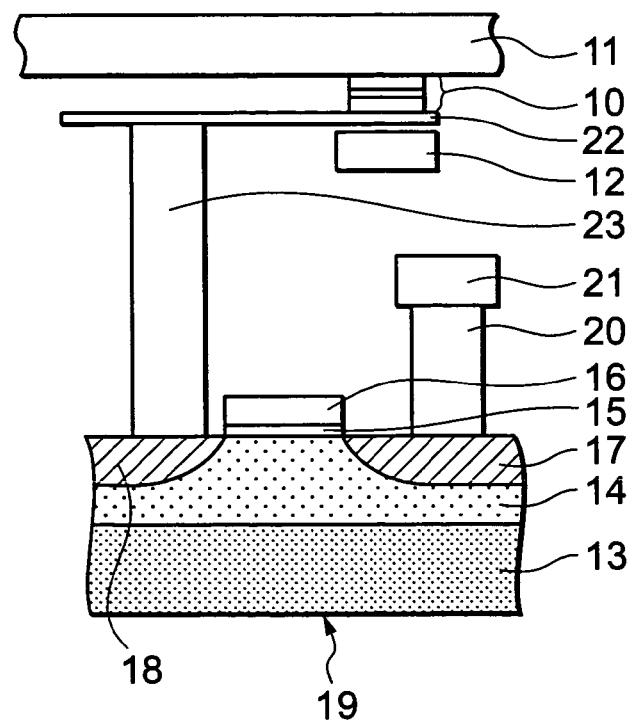
FIG. 16 is a cross-sectional view of a schematic diagram of a memory cell in MRAM.
Figure 17:
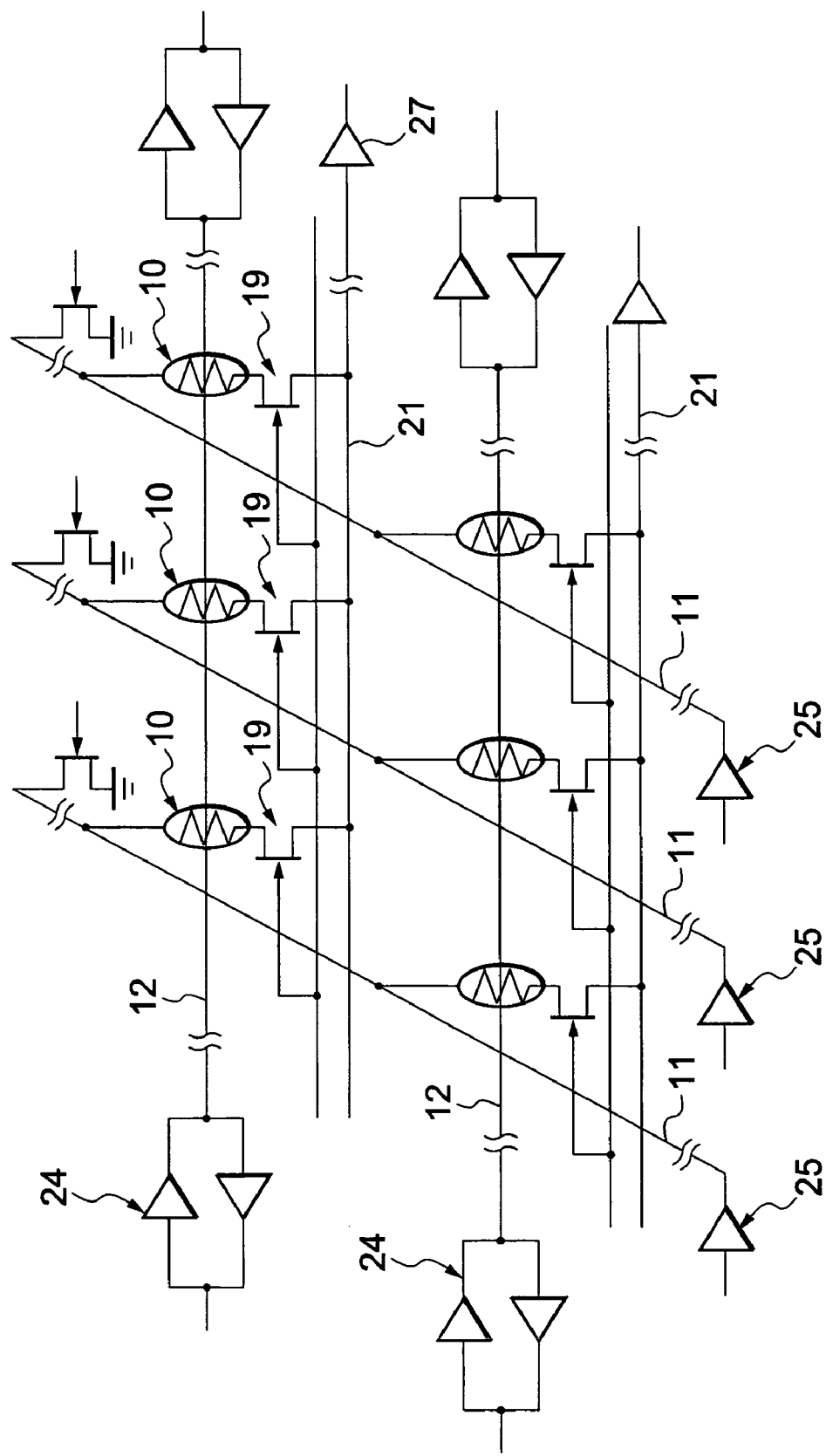
FIG. 17 is an equivalent circuit of an MRAM.
Figure 18:
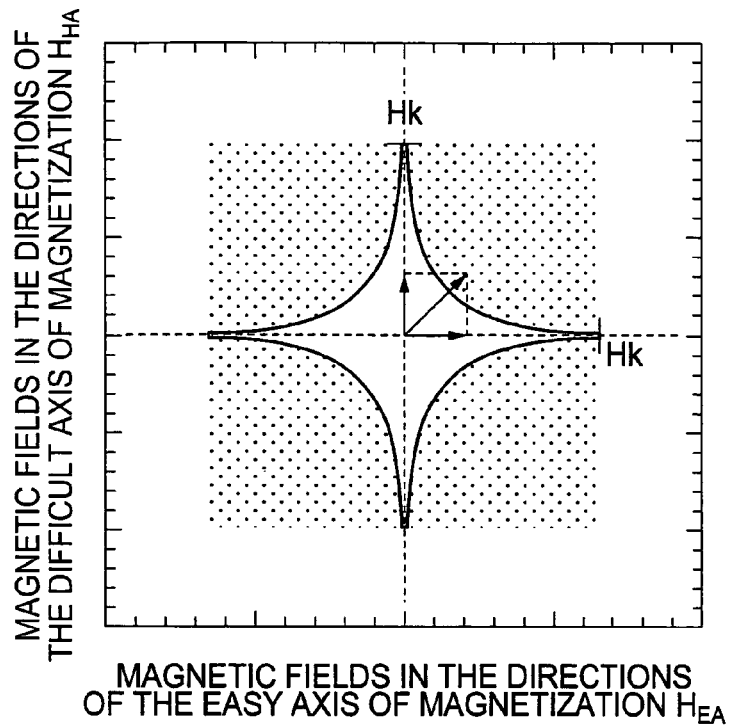
FIG. 18 is a diagram showing magnetic field response characteristics when writing to MRAM.
Figure 19:
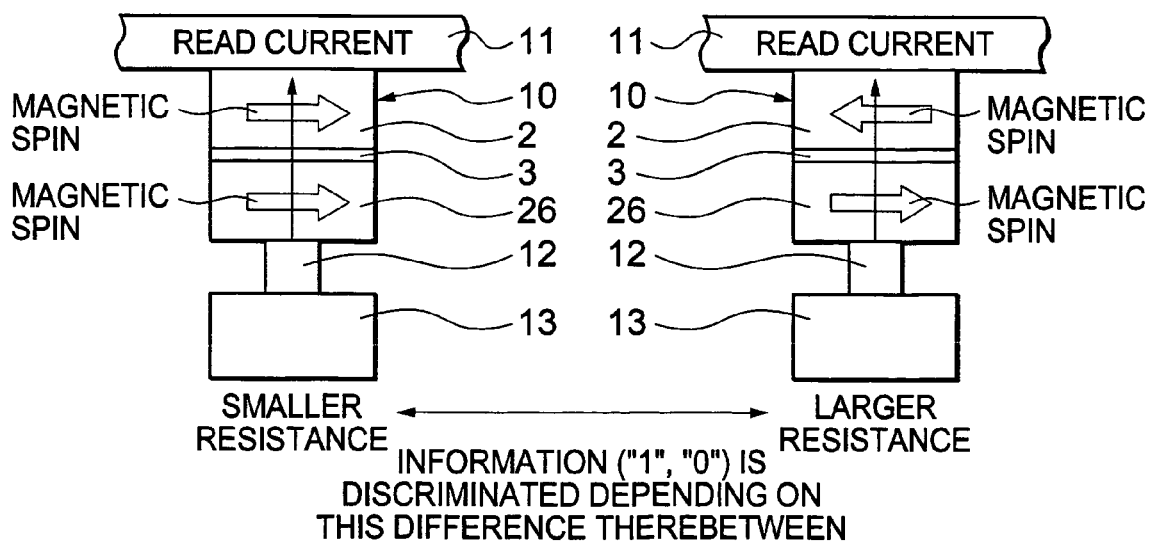
FIG. 19 is a diagram showing a principle of operation when reading from MRAM.

In the examples, MRAM elements 30 (each being a chip including a memory cell portion and a peripheral circuitry portion as shown in FIGS. 14 to 16) are mounted on a die pad 40 avoiding the edge portion and the central portion of the magnetic shield layers 33 and 34, then, all portions except for an external lead 31 (the die pad and the lead section inclusive of their wiring are simply drawn) to be connected to a package substrate (not shown) are sealed with a sealing material 32 such as mold resin (e.g. epoxy resin). Here, the description of the MRAM element 30 is omitted because of its similar structure and operation principle to those of the MRAM described already.

Further, according to the preferred embodiments of the present invention, there are shown an exemplary case (FIGS. 1A and 1B) where magnetic shield layers 33, 34 having a saturation magnetization at 1.8 T or more are disposed on the top and the bottom surfaces of a sealing material 32 which encapsulates MRAM elements 30 having built-in TMR elements together with other elements such as DRAM or the like (DRAM 45, DSP 46 and RF 47 to be described later), another exemplary case (FIG. 2) where the magnetic shield layers 33, 34 are disposed, within the sealing material 32, on the upper portion of the MRAM element 30 and on the lower portion of the die pad 40, and still another exemplary case (FIG. 3) where they are embedded in a non-contacting state, respectively.

Before sealing with the sealing material 32, it may be arranged such that in an intermediate region 41 of the magnetic shield layer 33, 34 by avoiding a central region 42 of the magnetic shield layer 33, 34 where a magnetic shield effect attenuates with saturation of magnetization, and where demagnetization becomes minimum due to a faster magnetic saturation therein, and also by avoiding an edge region 43 of the magnetic shield layer 33, 34 where the magnetic shield effect thereof becomes smallest as exposed directly to an external magnetic field, the MRAM elements 30 are secured on the die pad 40 in advance, then, after sealing thereof, the magnetic shield layers 33 and 34 are bonded to the top and the bottom of the sealing material 32. Alternatively, it may be arranged such that by disposing the MRAM elements 30 in the aforementioned intermediate region 41 before sealing thereof, and by disposing the magnetic shield layers 33, 34 at positions on both sides of the die pad 40 in a die, then, they are sealed simultaneously.

In any cases of the above, the MRAM element 30 has a structure as sandwiched between the magnetic shield layers 33, 34, and the magnetic shield layers 33, 34 are formed integral with the package of the MRAM. As described above, that the magnetic shield layers 33, 34 constitute a sandwich structure placed on the top and bottom of a MRAM (or on the top and bottom of a MRAM hybrid semiconductor package), and that they can be formed integral with the MRAM package provide for a most desirable structure for mounting on a circuit substrate.

In any of the magnetic shield structures illustrated in FIG. 1A to FIG. 3, generally, the MRAM element 30 can be magnetically shielded from an external magnetic field to some degrees, however, with a saturation of magnetization in the magnetic material, occurrence of attenuation of the magnetic shield effect cannot be avoided, and in particular, in the center portion thereof demagnetization becomes minimum, and in the edge portion of the magnetic shield layer 33, 34 where it is directly affected by the external magnetic field, the magnetic shield effect becomes minimal. In these cases, although it is preferable for the magnetic shield layer 33, 34 to exist both on the top and the bottom of the MRAM element 30, it may exist only, at least, on one side thereof (in particular, on the top side of MRAM element).

However, according to the preferred embodiment of the present invention, the MRAM elements 30 are placed avoiding the edge portion and the center portion of the magnetic shield layer 33, 34 so that the MRAM elements 30 are ensured to operate normally without being affected by an internal leakage magnetic field. Moreover, because the intermediate region 41 therebetween avoiding the center region 42 and the edge region 43 is a region in which the MRAM elements 30 are essentially free from the influence of the internal leakage magnetic field, a thickness of the magnetic shield layer can be designed to become thinner, as a result, enabling to make the MRAM device compacter and light-weighted (which will be described later).

Figure 4A:
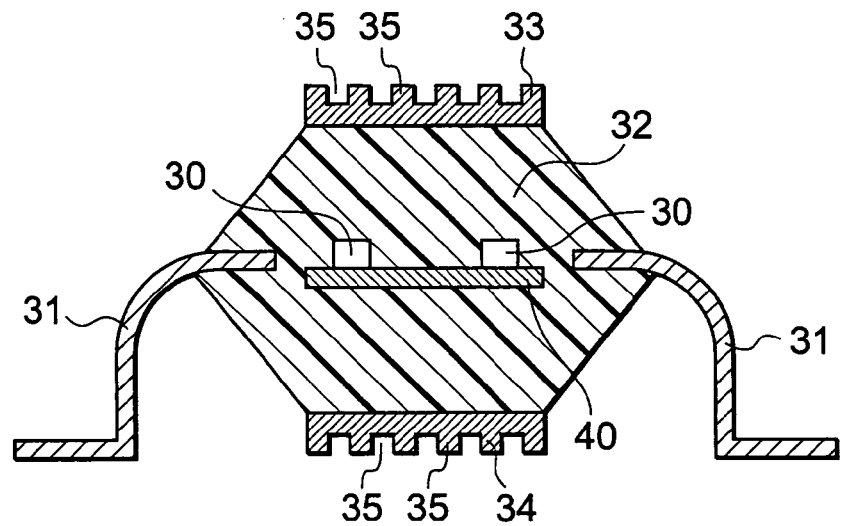
FIGS. 4A to 4B are cross-sectional views in schema of MRAM packages according to still more another preferred embodiment of the present invention.
Figure 4B:
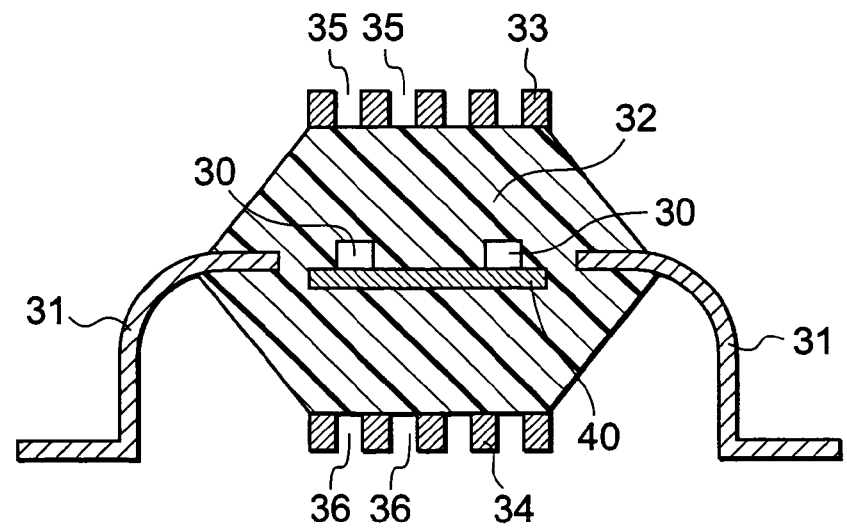

The magnetic shield layers 33, 34 illustrated in FIG. 1A to FIG. 3 are comprised of a flat film, foil, or a plate, however, it is not limited thereto, and it may be formed to have various shapes provided with, for example, irregularities 35 as depicted in FIG. 4A, or through-holes 36 in a mesh, slit or the like as depicted in FIG. 4B. The magnetic shield layers with the shape of FIG. 4A or 4b, because of presence of a shape anisotropy thereof not only in a circumferential edge portion thereof but also in the portions of the irregularities or the through-holes thereof, demagnetization against an externally applied magnetic field is generated, thereby suppressing the magnetic saturation to provide a shield effect of improved characteristics.

In any of the magnetic shield structures depicted in FIGS. 1A to 4B, saturation magnetization of the magnetic shield layers 33, 34 is 1.8 T or greater, which is substantially greater than those of a conventional ferrite, Permalloy or the like, and by disposing them on the sealing material or in a predetermined position within the sealing material, an excellent shield performance capable of suppressing the internal leakage magnetic field strength can be obtained.

The inventors of the present invention carried out experiments in order to achieve an appropriate environment that can guarantee a normal operation of a unit of MRAM elements even if a large dc external magnetic field as large as 500 Oe at maximum is applied.

With a progress of high density packaging technologies, the MRAM is used, in practice, in a multiple pin hybrid type packaging as mounted in mixture with other functional elements. As these packaging structures, there are cited a QFP (Quad Flat Package), LQFP (Low Profile Quad Flat Package), BGA (Ball Grid Array Package), LFBGA (Low Profile Fine Pitch Ball Grid Array Package), LFLGA (Low Profile Fine Pitch Land Grid Array Package) and the like.

Figure 5:
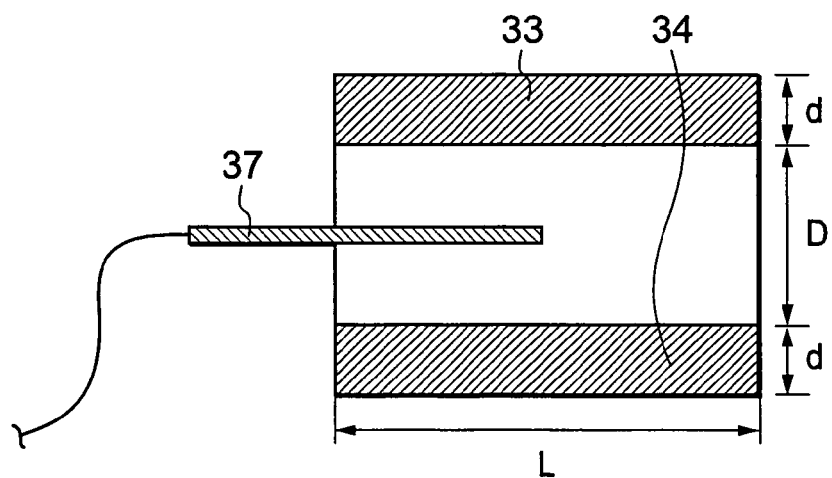
FIG. 5 is a cross-sectional view of a schematic diagram of a measuring apparatus for measuring an internal magnetic field strength at a position between magnetic shield layers according to the embodiment of the present invention.

Taking into consideration these package structures, the present inventors have studied a thinnest and most effective magnetic shield material. FIG. 5 shows a schematic diagram of an arrangement adopted in the experiments for studying magnetic shield effects of these materials. As a model case, magnetic shield layers 33, 34 are mounted on the top and the bottom of a 160 pin QFP type package as shown in FIGS. 1A and 1B, in which two sheets of shield layers of L: 28 mm×L: 28 mm are disposed at a distance of D: 3.45 mm, then in the center therebetween a gauss meter 37 is placed. Then, by applying a dc external magnetic field of 500 Oe parallel to the magnetic shield layers, and by moving the gauss meter 37 parallel to the magnetic shield layers, internal magnetic field strengths (leakage magnetic field strengths from the magnetic shield layers) are measured from the edge portion to the center portion thereof.

Figure 6:
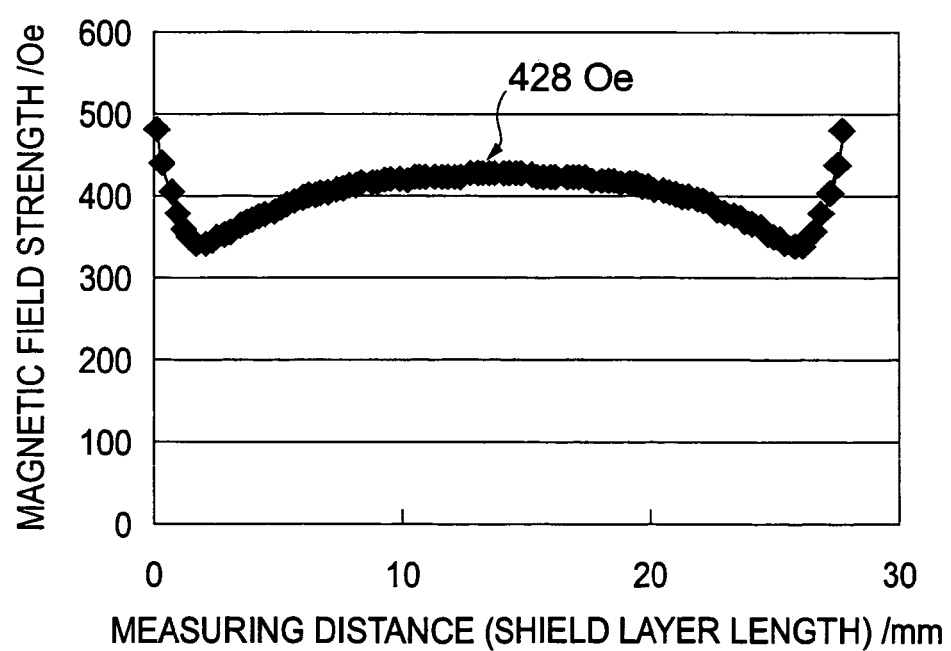
FIG. 6 is a distribution diagram of internal magnetic field strengths in the case where a high permeability material of Fe-75Ni-5Mo-1Cu was used, and when an external magnetic filed of 500 Oe was applied, according to the embodiment of the present invention.

An internal magnetic field strength distribution is shown in FIG. 6 for the case where, as a typical material among various shield materials, a super Permalloy: Fe-75Ni-5Mo-1Cu which is the highest permeability material was used as the magnetic shield layer material in the experiments. The Fe-75Ni-5Mo-1Cu has an initial permeability $\mu i=100000$, and saturation magnetization Ms=0.8 T. The internal magnetic field strengths are shown as a distribution over a length of the shield layer, that is, a length of 28 mm from one end to the other end. The external magnetic field to be applied was set at 500 Oe, and a thickness of the shield layer at 200 μm.

It is known from FIG. 6 that when a strong magnetic field of 500 Oe is applied from external, the magnetic shield layer made of Fe-75Ni-5Mo-1Cu suffers a magnetic saturation, thereby allowing penetration of magnetization of 428 Oe in the center portion of the package and thereby eliminating the shield effect almost all. Therefore, even if the structure to dispose the Mu metal layer as disclosed in U.S. Pat. No. 5,939,772 is adopted, the shield effect thereof is difficult to expect in practice.

Figures 7, 8:
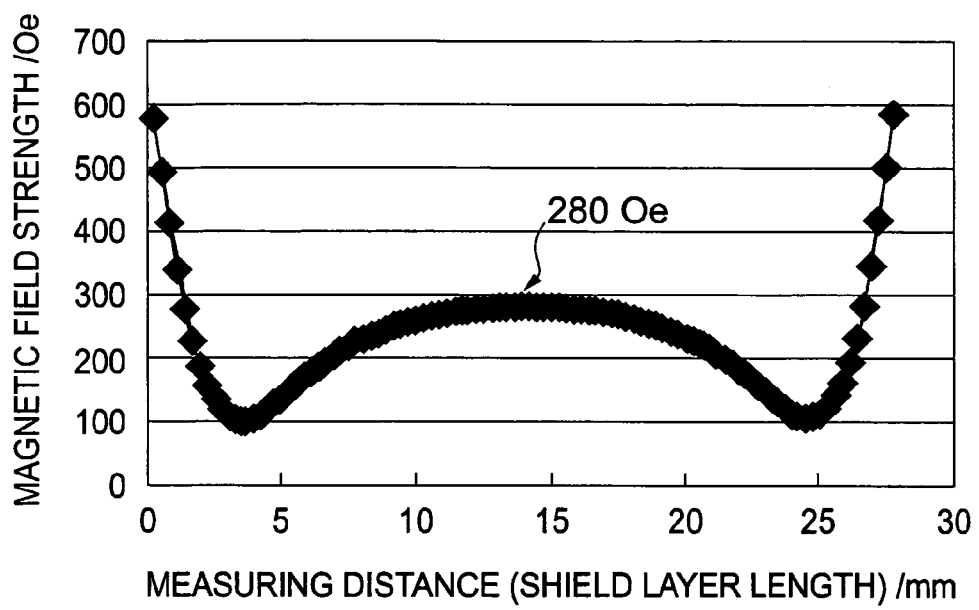
FIG. 7 is a distribution diagram of internal magnetic field strengths in the case where a high permeability material of Fe-49Co-2V was used, and a thickness of a magnetic shield layer (shield foil) was at 200 μm, and when an external magnetic field of 500 Oe was applied, according to the embodiment of the present invention.
FIG. 8 is a table showing internal magnetic field strengths versus thicknesses of magnetic shield layers when Fe-49Co-2V was used and an external magnetic field of 500 Oe was applied likewise.

On the other hand, a distribution of internal magnetic field strengths obtained using the experimental equipment of FIG. 5 is shown in FIG. 7, in which, in order to avoid magnetic saturation, a Permendur alloy: Fe-49Co-2V which is a high saturation magnetization material was used as the magnetic shield layer material. The Fe-49Co-2V has an initial permeability $_\mu i=1200$, and saturation magnetization Ms=2.3 T.

It is known from FIG. 7 that in the case where the Fe-49Co-2V was used as the magnetic shield layer material, a magnetization strength thereof in the center portion of the package became 282 Oe, thereby enabling to suppress the internal penetration magnetic field approximately to a half compared to that in the case where Fe-75Ni-5Mo-1Cu was used as its material. However, in an environment of 282 Oe, it is still difficult for the MRAM to operate normally.

Thereby, using Fe-49Co-2V as the magnetic shield material, with a gap between the shield layers set constant, and a thickness of the shield layer changed variously, a magnetic field strength in the center portion of the sandwich structure thereof was measured, a result of which is shown in FIG. 8.

Namely, FIG. 8 indicates experiments carried out using the experimental equipment shown in FIG. 5, in which a distance D between the magnetic shield layers was set constant (3.45 mm), an external magnetic field to be applied was set 500 Oe, and the thickness of the shield layers was changed variously at 200, 250, 270, 300, 320, 350, 400, 600 and 800 μm respectively, wherein the magnetic field strengths in the center portion became 282, 219, 193, 150, 117, 59, 18, 10, 10 Oe, respectively. As a result, it is known that with an increase in the thickness of the shield layers, a magnitude of a penetrating magnetic field can be reduced.

From the result indicated in FIG. 8, in order to ensure for the MRAM to operate normally, it is preferable to suppress the internal magnetic field strength as much as possible. Then, if an upper limit of the internal magnetic field strength is set at 20 Oe, it is considered consequently that a high saturation magnetization material such as Fe-49Co-2V or the like is to be used as a magnetic shield layer material and a thickness of the shield layer is to be set 400 μm or more. However, in the age in demand of more compact and light-weighted electronics devices, it is anticipated to become more difficult to mount two sheets of such a shield layer of 400 μm thick on the top and bottom within an electronic device. Nevertheless, if a stricter upper limit to the internal magnetic field strength is set, it becomes necessary for the thickness of the shield layers to be increased further.

Thereby, a novel arrangement enabling for the MRAM to be avoided from the external leakage magnetic even with a thinner shield layer by adjustment of the position of MRAM to be disposed within the package will be described in the following.

Figure 9:
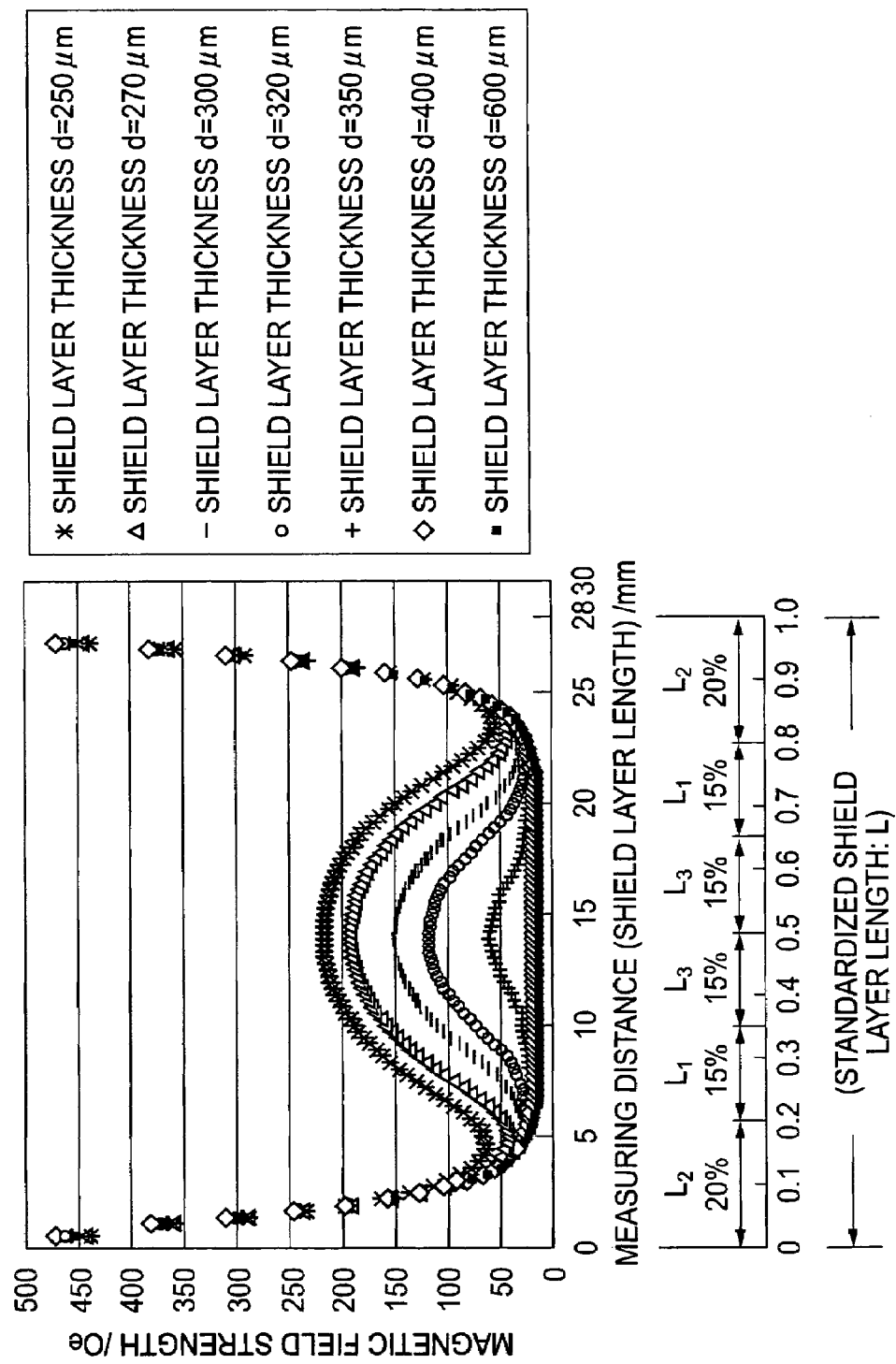
FIG. 9 is a distribution diagram showing internal magnetic field strengths versus lengths of magnetic shield layers with the thickness thereof changed variously, when said layers were made of Fe-49Co-2V and an external magnetic field of 500 Oe was applied likewise.

FIG. 9 shows a result of measurements of internal magnetic field strength distributions per various thicknesses of Fe-49Co-2V used as the material. The internal magnetic field strength shows a distribution relative to a length of the shield layer, that is, within L: 28 mm of FIG. 5. A gap between the shield layers was assumed constant (at 3.45 mm), an external magnetic field to be applied was assumed 500 Oe, and the thickness of the shield layer was varied 250, 270, 300, 320, 350, 400 and 600 μm.

As a result, as shown in FIG. 9, it is known that although a penetrating magnetic field strength became larger in the center portion and the edge portion of the package, a shield effect is exhibited in other portions outside the above, and that even with a thickness of 350 μm of the shield layer, a same shield effect as with a thickness of 600 μm thereof was exhibited except for the edge portion and the center portion of the package.

That is, as shown in the internal magnetic field strength distribution diagram of FIG. 9, in which a position corresponding to a length of 28 mm of the magnetic shield layer is specified as a reference to define a standard length thereof, and as shown along the standardized shield layer length defined above (refer to the bottom scale in FIG. 9), an intermediate region L1 (which corresponds to the aforementioned intermediate region 41) exclusive of a region L2 which is within 20% inward from both ends of the magnetic shield layer (which corresponds to the aforementioned edge region 43) and a region L3 which is within 15% outward from the center thereof (which corresponds to the aforementioned center region 42) is determined to be a region in which the internal magnetic field strength is reduced to less than 20 Oe, thereby exhibiting the magnetic shield effect sufficiently. This region L1 which has an annular pattern is an area on which MRAM elements 30 can be disposed.

A package of 160 pin QFP type has approximately a size of 28 mm×28 mm, of which an area available for MRAM is several square mm or 10 square mm at most. In consideration of this and the aforementioned result, MRAM elements 30 are disposed in a part of the intermediate region 41 avoiding the edge region 43 and the center region 42 of the magnetic shield layer within the package (refer to FIG. 13B). Thereby, even with a thickness of the shield layer set at 350 μm, the MRAM was confirmed to have been shielded from the external leakage magnetic field and to have operated normally.

Figure 11:
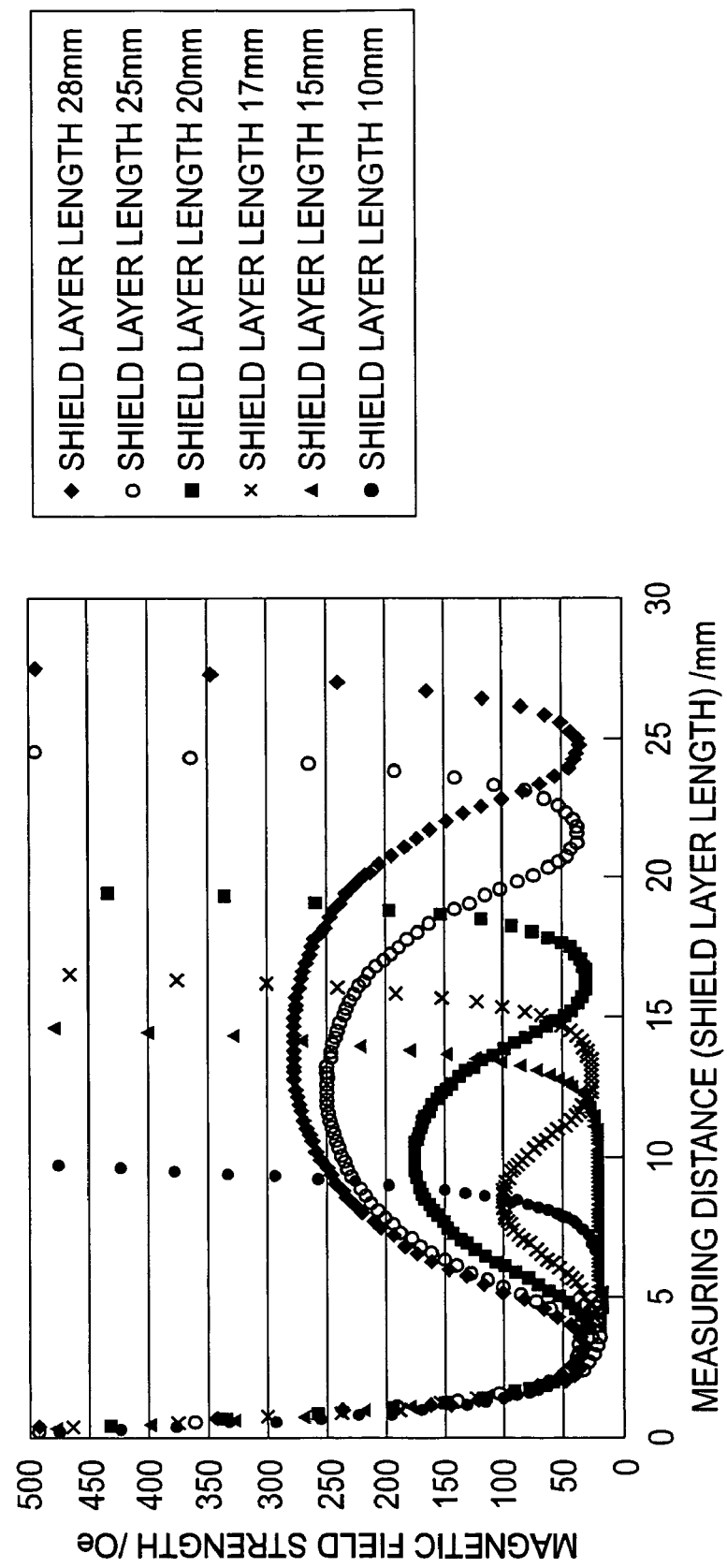
FIG. 11 is a distribution diagram of internal magnetic field strength versus lengths of magnetic shield layers having specified various lengths, made of Fe-49Co-2V, under application of an external magnetic field at 500 Oe, according to the embodiment of the invention.

In the next, using Fe-49Co-2V as the material of the magnetic shield layer in the experimental equipment shown in FIG. 5, with the gap between the shield layers set at 2 mm, the thickness of the shield layer at 200 μm, with an external magnetic field to be applied set constant at 500 Oe, then by changing the length of the shield layers variously, magnetic field strengths in the center portion of the sandwich structure were measured, the result of which is shown in FIG. 10, and distributions of the internal magnetic field strengths per length of the shield layer are shown in FIG. 11.

From this result, it is known that the longer the package length (shield layer length) becomes, the larger the internal magnetic field strength becomes, and that the shorter the package length becomes, the smaller the internal magnetic field strength is reduced.

FIG. 12 shows a distribution diagram of internal magnetic field strengths relative to the standardized package length, and respective regions where the MRAM elements can be mounted or not. Thereby it is revealed that the internal magnetic field strength distribution occurs not at a constant ratio but occurs depending on a package length.

From FIG. 12, as to the placement of the MRAM elements, it is preferable to dispose them apart from either end portion of the magnetic shield layer by 10% or more of the shield layer length inwardly, and in the case where the magnetic shield layer length exceeds 15 mm, it is preferable to dispose them apart by 20% or more of the shield layer length outward from the center of the shield layer.

However, because there may occur a slight change depending on a package length, a shield layer material, a gap between shield layers and the like, irrespective of the aforementioned conditions, it is preferable to carry out simulation at an initial stage of design to determine optimal positions of the MRAM elements.

Figure 13A:
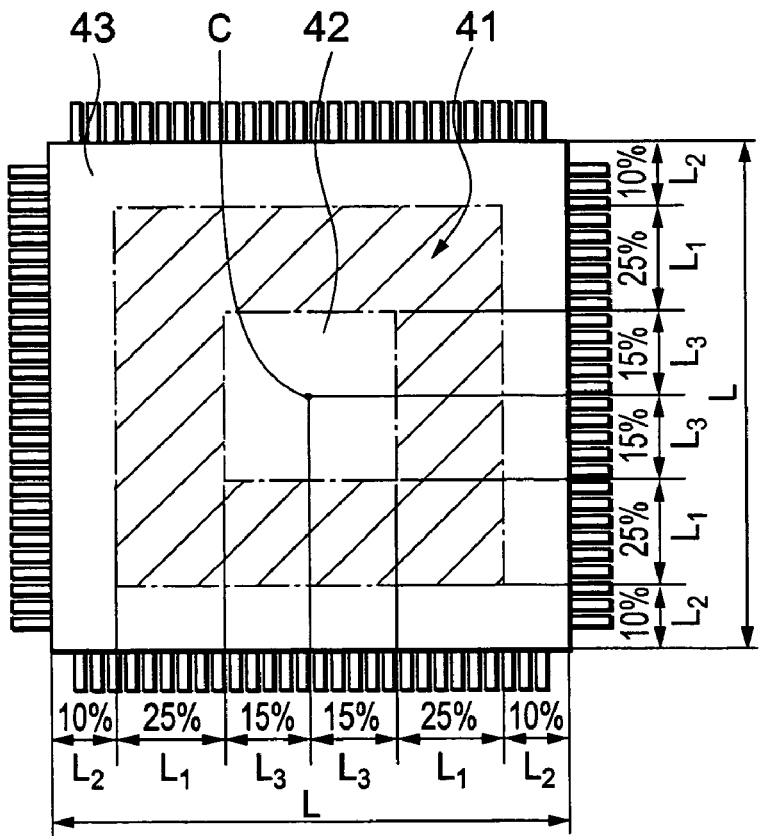
FIGS. 13A to 13B is a plan view showing an area within a package in which MRAM elements can be disposed (FIG. 13A) and a plan view showing a state of arrangements thereof (FIG. 13B) according to the embodiment of the invention.

FIG. 13A is a diagram showing respective areas in which the MRAM elements can be installed or can not relative to the magnetic shield layer, on the basis of each result in FIGS. 9 and 12.

That is, as shown in FIG. 13A, by avoiding the center region 42 which is within 15% outward from the center C of the magnetic shield layer, and the edge region 43 which is within 10% inward from the edge of the magnetic shield layer, and by disposing MRAM elements 30 in the intermediate region 41 therebetween (which has an annular pattern indicated by oblique lines, and which is within 25% of the length of the shield layer), it is ensured for the MRAM elements 30 to be operated normally.

Figure 13B:
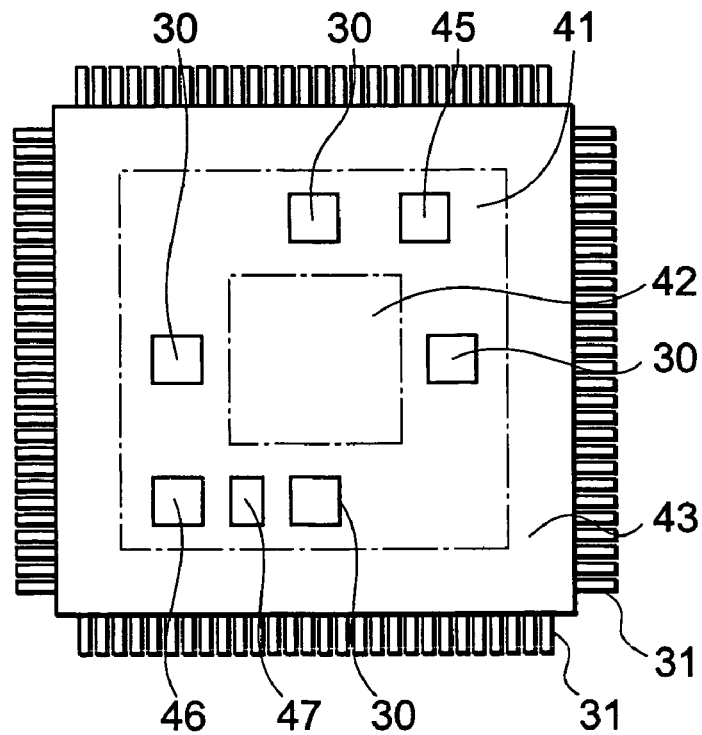

FIG. 13B shows a hybrid package in a state mounting various other elements, for example, such as DRAM (Dynamic Random Access Memory) 45, DSP (Digital Signal Processor) 46, RF (Radio Frequency) 47 and the like, together with the MRAM elements 30 on the intermediate region 41 in which the MRAM elements are allowed to be disposed. However, as to the aforementioned various other elements, it is not necessarily required to dispose them within the aforementioned intermediate region 41. In the center region 42, the aforementioned other elements and external connection terminals can be disposed as well.

By way of example, as to the soft magnetic material inclusive of the aforementioned exemplary Fe—Co—V systems from which to fabricate the magnetic shield layers, it may be any soft magnetic material at least if it contains one of Fe, Co and Ni, and may be preferably a soft magnetic material which has a high saturation magnetization and/or a high permeability, for example, such as Fe, FeCo, FeNi, FeSiAl, FeSiB, FeAl, or the like.

As described heretofore, according to the preferred embodiments of the present invention, by placing the MRAM elements in the intermediate region avoiding the edge region 43 and the center region 42 of the magnetic shield layers 33, 34, it is ensured for the MRAM elements 30 to operate normally without being affected by the internal leakage magnetic field. Moreover, as the intermediate region 41 excepting the center region 42 and the edge region 43 is such a region in which the MRAM elements 30 are essentially not affected by the internal leakage magnetic field even with a thin magnetic shield layer 33, 34, the magnetic shield layers can be designed to have a thinner thickness, as a result, the MRAM device can be fabricated compacter and more light-weighted.

Although the invention has been described in its preferred form with a certain degree of particularity, it should be understood that many other changes, modifications and combinations are possible without departing from the scope of the present invention.

For example, the aforementioned compositions and kinds of the magnetic shield layer material, thickness of the layers, arrangements and sizes thereof, or even the structures of the MRAM can be modified variously to the same effect.

Further, the above-mentioned magnetic shield structures may be combined appropriately. For example, it is possible to combine the structure of FIGS. 1A, 1B with the structure of FIG. 2, alternatively to combine the structure of FIGS. 1A, 1B with the structure of FIG. 3. Still further, it is also possible to omit the lower magnetic shield layer 34 in the structures described in FIGS. 1A through 4B.

Still more, although the present invention is suitable for applying to the MRAM, it is also applicable to any other magnetic memory storage having magnetic layers capable of magnetization.

As described heretofore, according to the present invention, by disposing the memory elements in the region excepting the edge portion and the center portion of the magnetic shield layer, that is, by disposing the memory elements in the intermediate portion between the center portion of the magnetic shield layer, where the magnetic saturation easily takes place and the internal leakage magnetic field strength becomes larger, and the edge portion of the magnetic shield layer, where no magnetic shield effect exists due to direct exposure to the external magnetic field, it is ensured for the memory elements to operate normally without being affected by the internal leakage magnetic field.

The invention claimed is:

1. A magnetic memory device constructed as a magnetic random access memory, said magnetic memory device comprising:
   a memory element having a magnetization pinned layer in which the orientation of magnetization is pinned, and a magnetic layer in which the orientation of magnetization is changeable; and
   a magnetic shield layer for magnetically shielding said memory element, said memory element disposed so as to avoid an edge portion and a center portion of said magnetic shield layer;
   wherein said memory element is disposed in a region between a position at 0.1 L inward from one side of said magnetic shield layer and a position at 0.15 L outward from the center of said magnetic shield layer toward one side thereof, where a length from one side of said magnetic shield layer to an opposed side thereof is L.

2. A magnetic memory device constructed as a magnetic random access memory, said magnetic memory device comprising:
   a memory element having a magnetization pinned layer in which the orientation of magnetization is pinned, and a magnetic layer in which the orientation of magnetization is changeable; and a magnetic shield layer for magnetically shielding said memory element, said memory element disposed so as to avoid an edge portion and a center portion of said magnetic shield layer;

wherein said magnetic shield layer is disposed on the top and/or bottom of a package having by sealing said memory element therein, or/and on the upper portion and/or the lower portion of said memory element within said package, and wherein said magnetic shield layer is formed of soft magnetic material that exhibits saturation magnetism at 1.8 tesla or more.

3. A magnetic memory device comprising:

a memory element having a magnetic layer capable of being magnetized; and a magnetic shield layer for magnetically shielding said memory element;

wherein said memory element is disposed so as to avoid an edge portion and a center portion of said magnetic shield layer, and wherein said memory element is disposed in a region between a position at 0.1 L inward from one side of said magnetic shield layer and a position at 0.15 L outward from the center of said magnetic shield layer toward one side thereof, where a length from one side of said magnetic shield layer to an opposed side thereof is L.

4. A magnetic memory device comprising:

a memory element having a magnetic layer capable of being magnetized; and a magnetic shield layer for magnetically shielding said memory element;

wherein said memory element is disposed so as to avoid an edge portion and a center portion of said magnetic shield layer, wherein said magnetic shield layer is disposed on the top and/or bottom of a package having by sealing said memory element therein, or/and on the upper portion and/or the lower portion of said memory element within said package, and wherein said magnetic shield layer is formed of soft magnetic material that exhibits saturation magnetism at 1.8 tesla or more.

5. A memory device according to claim 1 or 3, wherein said memory element is disposed in a region between a position at 0.2 L inward from said one side and a position at 0.15 L outward from the center of said shield layer toward said one side thereof, where said magnetic shield layer is provided on both sides of said memory element, and a distance between said magnetic shield layers, a length from said one side of said magnetic shield layer to the opposed side thereof, and an external magnetic field to be applied are constant respectively.

6. A memory device according to claim 1 or 3, wherein said memory element is disposed in a region between a position at 0.1 L inward from said one side thereof and a position at 0.2 L outward from the center of the shield layer toward said one side thereof, where a distance between said magnetic shield layers, a thickness of said magnetic shield layers, and an external magnetic field to be applied are constant respectively.

* * * * *